United States Patent [19]

Kiyohara

[11] Patent Number: 4,677,454
[45] Date of Patent: Jun. 30, 1987

[54] THYRISTOR WITH SELF-CENTERING HOUSING MEANS

[75] Inventor: Toyohiko Kiyohara, Itami, Japan

[73] Assignee: Mitsubishi Denki Kabushiki Kaisha, Tokyo, Japan

[21] Appl. No.: 903,898

[22] PCT Filed: Jul. 14, 1983

[86] PCT No.: PCT/JP83/00226
§ 371 Date: Mar. 19, 1984
§ 102(e) Date: Mar. 19, 1984

[87] PCT Pub. No.: WO84/00641
PCT Pub. Date: Feb. 16, 1984

Related U.S. Application Data

[63] Continuation of Ser. No. 598,281, Mar. 19, 1984, abandoned.

[30] Foreign Application Priority Data

Jul. 26, 1982 [JP]  Japan ................. 57-131434

[51] Int. Cl.[4] ......................................... H01L 29/74
[52] U.S. Cl. ........................................ 357/38; 357/30; 357/74; 357/79
[58] Field of Search ............... 357/38, 72, 74, 79, 357/30

[56] References Cited

U.S. PATENT DOCUMENTS

| 3,501,680 | 3/1970 | Martin et al. | 357/79 |
| 3,579,060 | 5/1971 | Davis | 317/235 R |
| 3,837,000 | 9/1974 | Platzoeoer et al. | 357/79 |
| 4,009,485 | 2/1977 | Koenig | 357/79 |

FOREIGN PATENT DOCUMENTS

| 234845 | 7/1964 | Austria . | |
| 1241536 | 6/1967 | Fed. Rep. of Germany | 357/79 |
| 2822888 | 12/1978 | Fed. Rep. of Germany . | |
| 54-979 | 1/1979 | Japan . | |
| 57-30350 | 2/1982 | Japan . | |

Primary Examiner—Joseph E. Clawson, Jr.
Attorney, Agent, or Firm—Lowe Price LeBlanc Becker & Shur

[57] ABSTRACT

An alignment of a light guide (10) and a photosensitive portion (1a) of an element (1) in a light-triggered thyristor is adapted such that, in order to eliminate a deviation or offset between the light guide and the photosensitive portion, an inner peripheral surface of a positioning ring (11) attached to an inner wall surface of an insulating cylinder (5) is machined, with respect to an axial center line which is a line extending to a tip portion of the light guide (10) on the element side, attached to the insulating cylinder (5), so that an inner diameter of a ring is made slightly larger than an outer peripheral surface of a reinforcing metal disc (2) to which the element (1) is fixed coaxially and the reinforcing metal disc (2) is inserted into the positioning ring (11).

5 Claims, 2 Drawing Figures

4,677,454

THYRISTOR WITH SELF-CENTERING HOUSING MEANS

This application is a continuation of application Ser. No. 598,281, filed Mar. 19, 1984, now abandoned.

TECHNICAL FIELD

The present invention relates to a thyristor and, more particularly, relates to an alignment of the element and the package thereof.

BACKGROUND TECHNIQUE

FIG. 1 is a cross sectional view showing an example of a conventional light-triggered thyristor.

In FIG. 1, (1) denotes an element of a light-triggered thyristor having a light-triggered photosensitive portion (1a) formed in a first major surface thereof, the photosensitive portion (1a) being a triggered portion, (2) denotes a reinforcing metal disc made of a metal material having a coefficient of thermal expansion approximate to that of the element (1), a second major surface of the element (1) being fixed to the reinforcing metal disc. (3) denotes a first electrode member which is made to be pressured and contacted to an electrode formed so as to surround the photosensitive portion (1a) in the first major surface of the element (1), (4) denotes a second electrode member pressured and contacted to the reinforcing metal disc (2), (5) denotes an insulating cylinder made of alumina ceramics and the like and being provided so as to surround the element (1), the reinforcing metal disc (2) and both electrode members (3) and (4), (6) denotes a first flange made of a ring-like metal plate and being fixed, in a gas-tight manner, to a first end surface of the insulating cylinder (5) and having an inner peripheral surface fixed in a gas-tight manner to the outer peripheral surface of the first electrode member (3), (7) denotes a second flange being fixed in a gas-tight manner to a second end surface of the insulating cylinder (5) and having an inner peripheral surface fixed in a gas-tight manner to an outer peripheral surface of the second electrode member (4), just like the first flange (6), (8) denotes a lateral groove being formed in an end surface of the first electrode member (3) opposed to the element (1) so as to extend internally radially from the outer peripheral surface thereof and extend beyond a portion corresponding to the photosensitive portion (1a), the width of the lateral groove being larger than the dimension of the photosensitive portion (1a), (9) denotes a through-hole provided in a portion of the insulating cylinder (5) corresponding to the lateral groove (7), and (10) denotes a light guide made of a glass bar member having a large transmittance and having a first end portion adjacent to the photosensitive portion (1a) and a second end portion leading to an exterior of the insulating cylinder (5) through the lateral groove (8) and the through-hole (9) so that an outer peripheral surface of the second end portion is sealed in a gas-tight manner to an inner wall surface of the through-hole (9), the light guide (10) being a guide for a trigger signal for guiding a triggering light signal from the exterior to the photosensitive portion (1a).

Now, an assembling procedure of such conventional example will be described.

First, an insulating cylinder (5) is prepared which inner peripheral surface is ground precisely using a grinding wheel of diamond and the like, so that the inner diameter thereof is slightly larger than the outer diameter of the reinforcing metal disc (2) in order to arrange the reinforcing metal disc (2) therein, and then the first electrode member (3) is inserted from the first end surface side of the insulating cylinder (5) into the interior thereof so that the first electrode member (3) is fixed in a gas-tight manner, to the first end surface of the insulating cylinder (5) by using the first flange (6).

Then, with the tip of the first end portion of the light guide (10) not exceeding the level of the end surface of the first electrode member (3) and being precisely positioned in an axial center of the insulating cylinder (5), the outer peripheral surface of the second end portion of the light guide (10) is fixed in a gas-tight manner to the inner wall surface of the through-hole (9). Subsequently, the photosensitive portion (1a) of the element (1) and a center portion of the reinforcing metal disc (2) are made to coincide with each other so that the element (1) is fixed onto the surface of the reinforcing metal plate (2). Then, the reinforcing metal disc (2) having the element (1) fixed thereto is rested on the end surface of the second electrode member (4) so that the reinforcing metal disc (2) contacts with the end surface. The rested body is inserted from the second end surface of the insulating cylinder (5) into the interior thereof, so that the element (1) is made to contact with the end surface of the first electrode member (3) and the second electrode member (4) is fixed in a gas-tight manner to the second end surface of the insulating cylinder (5) by using the second flange (7). Thus, such conventional assembling operation is completed.

On the other hand, in such a conventional example, there are some possibilities that a slight deviation or offset between the tip of the light guide (10) and the photosensitive portion (1a) may occur, since it is extremely difficult to seal the outer peripheral surface of the second end portion of the light guide (10) to the inner wall surface of the through-hole (9), with the tip of the first end portion of the light guide (10) being precisely positioned in an axial center of the insulating cylinder (5) and also it is extremely difficult to fix the element (1) to the major surface of the reinforcing metal disc (2) with the photosensitive portion (1a) of the element (1) being registered with the center of the reinforcing metal disc (2). In case where such deviation or offset occurs, the amount of transmission of a light signal from the tip of the light guide (10) to the photosensitive portion (1a) decreases and a light triggered sensitivity becomes worse and hence there is a fluctuation of the light-triggered sensitivity. In addition, it takes much time to grind precisely an inner peripheral surface of the insulating cylinder (5) made of alumina ceramics and the like, which makes a manufacturing cost higher.

DISCLOSURE OF THE INVENTION

The present invention is such that an outer periphery of a reinforcing metal disc having an element fixed thereto is machined with respect to an axial center line which is a normal of a major surface of the reinforcing metal disc passing through a triggered portion of the element, an inner peripheral surface of a positioning ring attached to an inner peripheral surface of the insulating cylinder is machined with respect an axial center line which is a line passing through a tip portion of a trigger signal guide attached to the insulating cylinder, contacting or adjacent to the triggered portion of the element, and being along the axial center line of the insulating cylinder, so that an inner diameter of the inner peripheral surface of the positioning ring is made larger than that of the outer peripheral surface of the reinforcing metal disc, and the reinforcing metal disc having the element fixed thereto is inserted into the positioning ring fixed to the insulating cylinder. In accordance with the present invention, there is no deviation or offset between the tip portion of a trigger signal guide and a triggered portion of the element. Accordingly, a trigger sensitivity becomes better and a fluctuation of a trigger sensitivity never occurs. In addition, an operation for grinding an inner peripheral surface of an insulating cylinder is not required and hence the manufacturing cost can be reduced.

BEST MODE FOR CARRYING OUT THE INVENTION

Figure 2:
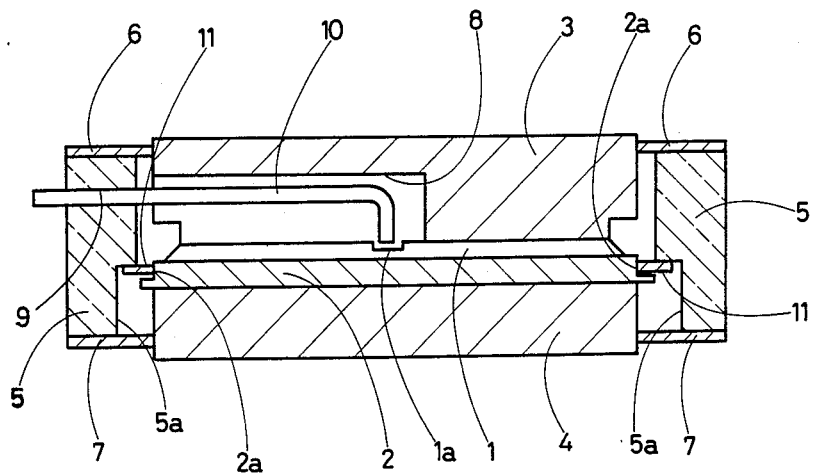

FIG. 2 is a cross sectional view showing a light-triggered thyristor of an embodiment of the present invention.

Figure 1:
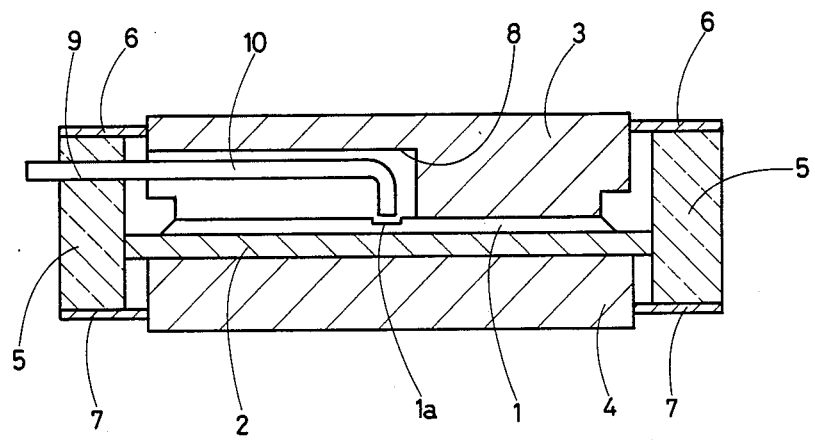
FIG. 1 is a cross sectional view showing an example of a conventional light-triggered thyristor and FIG. 2 is a cross sectional view showing a light-triggered thyristor of an embodiment of the present invention.

In FIG. 2, the same reference numerals as those of the conventional example shown in FIG. 1 indicate the same portions. (2a) denotes a cut portion having a predetermined outer diameter so that the reinforcing metal disc (2) having an element (1) fixed thereto is cut throughout the peripheral portion of the first major surface thereof and toward the second major surface from the first major surface, but not so as to reach the second surface, by means of machining such as a lathe and an NC milling machine with respect to an axial center line which is a normal of the major surface of the reinforcing metal disc (2) passing through a center of the photosensitive portion (1a) of the element (1). (5a) denotes a notched portion formed such that the inner peripheral surface portion of the insulating cylinder (5) is notched from the end surface thereof on the second electrode member (4) side toward the other end surface thereof so that a stepped wall surface is formed in an inner peripheral surface portion of the insulating cylinder (5) corresponding to the cut portion (2a) of the reinforcing metal disc (2) radially of the cylinder (5). (11) is a positioning ring made of a ring-like metal plate and having an outer peripheral surface fixed onto the stepped wall surface of the notched portion (5a) of the insulating cylinder (5) and an inner peripheral surface with an inner diameter slightly larger than the outer diameter of the cut portion (2a) of the reinforcing metal disc (2), the positioning ring positioning the reinforcing metal disc (2) by the cut portion (2a) being inserted thereinto. The inner peripheral surface of the positioning ring (11) is cut by means of machining such as a lathe and an NC milling machine with respect to an axial center line which is extending to a center of the tip of the first end portion of the light guide (10) and along the axial center line of the insulating cylinder (5), after the electrode member (3) is fixed to the end surface of the insulating cylinder (5) on the side opposite to the notched portion (5a) side, through the first flange (6) thereof and the outer peripheral surface of the second end portion of the light guide (10) is sealed to the inner wall surface of the through-hole (9), with the tip portion of the first end portion of the light guide (10) not exceeding the level of the end surface of the first electrode member (3) and being positioned in a center portion of the insulating cylinder (5).

Now, an assembling procedure of the embodiment will be described.

First, an element (1) is fixed onto the first major surface of the reinforcing metal disc (2) in which a cut portion (2a) has not been made, so that the photosensitive portion (1a) thereof is substantially positioned in a center portion of the first major surface of the reinforcing metal disc (2). Then, the cut portion (2a) having a predetermined outer diameter is formed over all of the peripheral edge portion of the first major surface of the reinforcing metal disc (2) and extending from the first major surface to the second major surface but not reaching the second major surface, by means of machining such as a lathe and an NC milling machine with respect to an axial center line which is a normal of the major surface of the reinforcing metal disc (2) extending to the photosensitive portion (1a). Meanwhile, although the outer peripheral surface of the reinforcing metal disc (2) including the cut portion (2a) is formed in a stepped fashion since a gripping margin is required for attaching the reinforcing metal disc (2) to a machine tool, a peripheral surface of the reinforcing metal disc (2) may be formed with the same diameter by means of any other machining. In any case, it is preferred that the width of the cut portion (2a) is made larger than the thickness of the positioning ring (11). On the other hand, the positioning ring (11) is fixed onto the stepped wall surface of the notched portion (5a) of the insulating cylinder (5). The inner diameter of the inner peripheral surface of the positioning ring (11) at that time is made sufficiently smaller than the outer diameter of the cut portion (2a) of the reinforcing metal disc (2). Then, the first electrode member (3) is inserted into the insulating cylinder (5) from the end surface side opposite to the notched portion (5a) of the insulating cylinder (5) to which the positioning ring (11) is fixed and, the first electrode member (3) is fixed in a gas-tight manner to the end surface of the insulating cylinder (5) through the first flange (6). Then, with the tip of the light guide (10) on the first end portion side not exceeding a level of the end surface of the first electrode member (3) and being positioned in a center portion of the insulating cylinder (5), an outer peripheral surface of the light guide (10) on the second end portion side is sealed to an inner wall surface of the through-hole (9). Thereafter, the inner peripheral surface portion of the positioning ring (11) is cut by means of machining such as a lathe and an NC milling machine with respect to an axial center line which is a line extending to the center of the tip of the first end of the light guide (10) and along the axial center line of the insulating cylinder (5), so that the inner diameter thereof is made slightly larger than the outer diameter of the cut portion (2a) of the reinforcing metal disc (2). Subsequently, the reinforcing metal disc (2) with the element (1) fixed thereto and having a cut portion (2a) formed therein is rested on the end surface of the second electrode member (4). The rested body is inserted from the notched portion (5a) side of the insulating cylinder (5) into the interior thereof so that the cut portion (2a) in the reinforcing metal disc (2) is fit in the positioning ring (11). Then, the element (1) is made to contact with the end surface of the first electrode member (3) so that the second electrode member (4) is fixed, in a gas-tight manner, to the end surface of the notched portion (5a) in the insulating cylinder (5)

through the second flange (7). Thus, the assembling operations of the present embodiment are completed.

In the present embodiment, since the tip portion of the light guide (10) is disposed over the axial center line of the inner peripheral surface of the positioning ring (11) and the photosensitive portion (1a) of the element (1) is disposed over the axial center line of the outer peripheral surface of the cut portion (2a) in the reinforcing metal disc (2), a deviation or an offset between the tip portion of the light guide (10) and the photosensitive portion (1a) of the element (1) never occurs, by fitting the cut portion (2a) in the positioning ring (11). Accordingly, the situation never occurs where a light triggering sensitivity becomes worse and there is a fluctuation of a light triggering sensitivity such as in a conventional example shown in FIG. 1. In addition, since the operation for grinding a peripheral surface of the insulating cylinder (5), which is required in the above described conventional example, is not required, it is possible to reduce a manufacturing cost.

Meanwhile, although the foregoing has been explained by way of a light-triggered thyristor, the present invention is not restricted to such thyristor and applies in other thyristors comprising an element of a thyristor having a gate electrode in a middle portion of one major surface and having other major surface fixed to the reinforcing metal disc.

INDUSTRIAL APPLICABILITY

The present invention applies not only in alignment of the light guide of a light-triggered thyristor and a photosensitive portion of an element, but also in an alignment of a gate lead of a thyristor and a gate electrode of an element.

What is claimed is:
1. A thyristor comprising:
   a thyristor element having in a center portion of a major surface thereof a triggered portion receiving a triggering signal, said element further including an other major surface formed opposite said major surface,
   a reinforcing metal disc formed with opposite first and second major surfaces and having a thermal expansion coefficient corresponding to that of said element, said first major surface of said disc fixed to said other major surface of said element;
   a first electrode member in contact with an electrode formed in the major surface portion of said element;
   a second electrode member in contact with the second major surface of said reinforcing metal disc;
   an insulating cylinder surrounding said element and said first and second electrode members so that the insulating cylinder is sealed with both end surfaces thereof and said first and second electrode members;
   a triggering signal guide made of a bar-like member guiding a triggering signal and having one end adjacent said triggered portion and an other end passing through said insulating cylinder and sealed thereto in a gas-tight manner; and
   a positioning ring made of a ring-like metal plate and having an outer peripheral portion fixed to an inner peripheral portion of said insulating cylinder opposite the side surface portion of said reinforcing metal disc and having an inner peripheral surface to which said reinforcing metal disc is inserted for holding, and wherein
   the outer peripheral portion of said reinforcing metal disc is cut tangentially with respect to an axial center which is a center of said triggered portion of the element fixed to said reinforcing metal plate, so that a real circle with a predetermined diameter can be formed, and
   said inner peripheral portion of said positioning ring is cut with respect to an axial center line which is a line passing through a center of a tip portion on the element side of aid trigger signal guide and along an axial center of the insulating cylinder, so that a real circle is formed,
   whereby the outer peripheral portion of the reinforcing metal disc is inserted, for holding, into the inner peripheral portion of the positioning ring in close fit.
2. A thyristor in accordance with claim 1, wherein the electrode formed in the major surface of the element surrounds the triggered portion, and
   said insulating cylinder has a groove width provided in an end surface portion of the first electrode member on the element side so as to extend from the outer peripheral surface radially thereof and beyond the portion corresponding to the triggered portion and being larger than the triggered portion.
3. A thyristor in accordance with claim 2, wherein said insulating body has a notched portion to which the positioning ring is fixed in a peripheral surface thereof.
4. A thyristor in accordance with claim 3, wherein said triggering signal guide is a light guide and the triggered portion is a photosensitive portion.
5. A thyristor in accordance with claim 3, wherein said triggering signal guide is a gate lead and said triggered portion is a gate electrode.

* * * * *